(12) United States Patent
Nagayama et al.

(10) Patent No.: US 10,198,028 B2
(45) Date of Patent: Feb. 5, 2019

(54) DISPLAY PANEL, DISPLAY PANEL ASSEMBLY AND METHOD OF MANUFACTURING THE SAME, AND DISPLAY DEVICE

(71) Applicant: BOE Technology Group Co., Ltd., Beijing (CN)

(72) Inventors: Kazuyoshi Nagayama, Beijing (CN); Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 302 days.

(21) Appl. No.: 15/129,008

(22) PCT Filed: Apr. 29, 2015

(86) PCT No.: PCT/CN2015/077793
§ 371 (c)(1),
(2) Date: Sep. 26, 2016

(87) PCT Pub. No.: WO2016/101476
PCT Pub. Date: Jun. 30, 2016

(65) Prior Publication Data
US 2018/0114470 A1    Apr. 26, 2018

(30) Foreign Application Priority Data
Dec. 25, 2014   (CN) .......................... 2014 1 0827800

(51) Int. Cl.
*G06F 1/16* (2006.01)
*G02F 1/1333* (2006.01)
(Continued)

(52) U.S. Cl.
CPC ...... *G06F 1/1601* (2013.01); *G02F 1/133308* (2013.01); *H01L 27/3244* (2013.01);
(Continued)

(58) Field of Classification Search
CPC .................... G09G 2300/026; G09G 2380/02
See application file for complete search history.

(56) References Cited

U.S. PATENT DOCUMENTS 9,291,843 B2 * 3/2016 Yeo .................. G02F 1/133305
9,358,830 B1 * 6/2016 McLaughlin ............ B44D 3/18
(Continued)

FOREIGN PATENT DOCUMENTS

CN           101996535 A       3/2011
CN           103473998 A      12/2013
(Continued)

OTHER PUBLICATIONS

International Search Report and Written Opinion, including English translation of Box No. V of the Written Opinion, for International Application No. PCT/CN2015/077793, dated Sep. 2, 2015, 8 pages.

*Primary Examiner* — Gene W Lee
(74) *Attorney, Agent, or Firm* — Westman, Champlin & Koehler, P.A.

(57) ABSTRACT

A display panel has a displaying side and a back side opposite to the displaying side. The display panel comprises: a rectangular display region for displaying an image, the rectangular display region having four sides and four corners formed by adjacent sides respectively; and an outer region surrounding the rectangular display region, the outer region being in a shape of a rectangular frame, and the outer region having four side portions corresponding to the four sides of the rectangular display region and four corner portions each connecting two adjacent side portions respectively, the outer region being provided therein with a closed frame-shaped enclosing structure extending along the entire outer region. Each corner portion is folded along three folding lines provided at the corner portion.

20 Claims, 2 Drawing Sheets

(51) Int. Cl.
*H01L 27/32* (2006.01)
*H01L 51/00* (2006.01)
*G02F 1/1335* (2006.01)

(52) U.S. Cl.
CPC ...... *H01L 27/3293* (2013.01); *H01L 51/0097* (2013.01); *G02F 1/133608* (2013.01); *G02F 2001/13332* (2013.01); *G09G 2300/026* (2013.01); *H01L 2251/5338* (2013.01)

(56) References Cited

U.S. PATENT DOCUMENTS

| | | | | |
|---|---|---|---|---|
| 9,459,656 | B2* | 10/2016 | Shai | G06F 1/1615 |
| 9,489,913 | B2* | 11/2016 | Kwak | G06F 3/0487 |
| 9,646,407 | B2* | 5/2017 | Lee | G06F 3/041 |
| 9,894,755 | B2* | 2/2018 | Kim | H05K 1/028 |
| 9,952,706 | B2* | 4/2018 | Cho | G06F 3/0487 |
| 10,061,356 | B2* | 8/2018 | Jin | G06F 1/1637 |
| 2008/0079656 | A1 | 4/2008 | Kee et al. | |
| 2011/0050657 | A1 | 3/2011 | Yamada | |
| 2014/0028596 | A1* | 1/2014 | Seo | G06F 3/0487 345/173 |
| 2014/0028597 | A1* | 1/2014 | Cho | G06F 3/0487 345/173 |
| 2015/0227173 | A1* | 8/2015 | Hwang | G06F 1/1652 345/619 |
| 2016/0014882 | A1* | 1/2016 | Jongman | G02F 1/13452 361/749 |
| 2017/0117342 | A1* | 4/2017 | Kwon | G09G 3/325 |
| 2018/0076415 | A1* | 3/2018 | Chung | G09G 3/3266 |

FOREIGN PATENT DOCUMENTS

| | | |
|---|---|---|
| CN | 104464540 A | 3/2015 |
| CN | 204303275 U | 4/2015 |
| JP | 2011-047977 A | 3/2011 |
| JP | 2014-191532 A | 10/2014 |

* cited by examiner

DISPLAY PANEL, DISPLAY PANEL ASSEMBLY AND METHOD OF MANUFACTURING THE SAME, AND DISPLAY DEVICE

CROSS-REFERENCE TO RELATED APPLICATION

This Application is a Section 371 National Stage Application of International Application No. PCT/CN2015/077793, filed 29 Apr. 2015 and published as WO 2016/101476 A1 on 30 Jun. 2016, in Chinese, the contents of which are hereby incorporated by reference in their entirety.

TECHNICAL FIELD

Embodiments of the present disclosure relate to the field of display technologies, and specially, to a display panel and a display panel assembly, a method of manufacturing the display panel assembly, and a display device.

BACKGROUND

There is a technique in prior art to form a large display panel assembly by assembling a plurality of display panels. A display panel has a displaying side and a back side opposite to the displaying side, and the display panel includes: a rectangular display region for displaying an image; and outer regions surrounding the display region. Each of the outer regions is in a shape of a rectangular frame, and has an enclosing structure and a circuit structure for the display region disposed therein. The circuit structure includes a data signal circuit structure and a gate drive circuit structure.

Due to the outer regions, however, a non-display region exists between two adjacent display panels, such that display screen of the display panel assembly is divided by the outer regions, and display effect is significantly affected.

JP2011-047977 provides a technical solution to remove side portions from a display screen. Specifically, each of corner portions of a rectangular outer region is cut away, such that a rectangular sub-outer region having a length that is the same as a length of a corresponding side of the rectangular display region is remained, and four rectangular sub-outer regions may be folded towards a back side of the display region. When viewed in front of the rectangular display region after all the rectangular sub-outer regions are folded, no rectangular sub-outer region can be seen. Therefore, when a plurality of light-emitting display panels which have been processed as above are assembled together, no side portion exists between two adjacent light-emitting display panels.

Electronic components (such as an OLED, a TFT and the like) in the display panel are sensitive to moisture and oxygen. Infiltration of moisture and oxygen into an electronic component is a main factor adversely affecting service life thereof. Therefore, typically, an enclosing structure is used to isolate the components from moisture and oxygen. In the technical solution of JP2011-047977, however, the enclosing structure is incomplete or in a non-enclosed state due to cutting away the corner portions, such that moisture and oxygen can easily infiltrate into the display panel through the cuts and contact the electronic components, service life of the display panel is thereby significantly and adversely affected.

SUMMARY

An object of the present disclosure is to provide a display panel, in which side portions on outer sides of a display region can be removed or reduced without harming completeness of its enclosing structure.

In an aspect of the present disclosure, there is provided a display panel having a displaying side and a back side opposite to the displaying side. The display panel may comprise: a rectangular display region for displaying an image, the rectangular display region having four sides and four corners formed by adjacent sides respectively; and an outer region surrounding the rectangular display region, the outer region being in a shape of a rectangular frame, the outer region having four side portions corresponding to the four sides of the rectangular display region respectively and four corner portions each connecting two adjacent side portions, the outer region being provided therein with a closed frame-shaped enclosing structure extending along the entire outer region. Three folding lines are provided at each of the corner portions of the outer region, a first folding line and a second folding line of the three folding lines lie in extension lines of two adjacent sides of the rectangular display region respectively, and a third folding line of the three folding lines extends from a corner of the rectangular display region corresponding to one of the corner portions along a straight line between the first folding line and the second folding line.

According to an exemplary embodiment of the display panel, included angles between the third folding line and the first folding line and between the third folding line and the second folding line may be 45 degrees.

According to another exemplary embodiment of the display panel, the side portions of the outer region may have the same width.

According to another exemplary embodiment of the display panel, a direction of folding along the first folding line and a direction of folding along the second folding line may be opposite to a direction of folding along the third folding line, the direction of folding along the first folding line and the direction of folding along the second folding line are set towards the back side of the display panel, and the direction of folding along the third folding line is set towards the displaying side of the display panel.

According to another exemplary embodiment of the display panel, a direction of folding along the first folding line and a direction of folding along the third folding line may be opposite to a direction of folding along the second folding line, the direction of folding along the first folding line and the direction of folding along the third folding line are set towards the back side of the display panel, and the direction of folding along the second folding line is set towards the displaying side of the display panel.

According to another exemplary embodiment of the display panel, the display panel may further comprise circuit structures used for the rectangular display region, the circuit structures being disposed within the side portions of the outer region.

According to another exemplary embodiment of the display panel, the circuit structures may comprise a data signal circuit structure and a gate driving circuit structure, and the display panel may further comprise: a signal COF located outside of the outer region and connected with the data signal circuit structure; and a gate driving COF located outside of the outer region and connected with the gate driving circuit structure.

According to another exemplary embodiment of the display panel, the signal COF and the gate driving COF may be arranged such that they are disposed at the back side of the display panel when the display panel is folded.

In another aspect of the present disclosure, there is provided a display panel assembly. The display panel assembly may comprise: a m*n display panel array comprised of a plurality of the display panels according to any one of claims 1 to 8, wherein each of m and n is a natural number, and the rectangular display regions of the plurality of display panels are spliced together to form a larger rectangular display region.

In a further aspect of the present disclosure, there is provided a method of manufacturing a display panel assembly. The method may comprise steps of:

providing a plurality of display panels, wherein each of the display panels has a displaying side and a back side opposite to the displaying side, each of the display panels includes a rectangular display region and an outer region surrounding the rectangular display region, each rectangular display region has four sides and four corners each formed by two adjacent sides of the four sides, each outer region is in a shape of a rectangular frame, the outer region has four side portions and four corner portions corresponding to the four corners of the rectangular display region respectively, and the outer region is provided therein with a closed frame-shaped enclosing structure extending along the entire outer region;

folding each outer region towards the back side along boundary lines between the side portions and the rectangular display region, and folding each of the corner portions of the outer region along three folding lines provided at a corresponding corner portion of the outer region, a first folding line and a second folding line of the three folding lines lying in extension lines of two adjacent sides of the rectangular display region respectively, a third folding line of the three folding lines extending from a corner of the rectangular display region corresponding to one of the corner portions along a straight line between the first folding line and the second folding line; and splicing the rectangular display regions of the plurality of display panels together to form a larger display region.

According to an exemplary embodiment of the method, the step of splicing the rectangular display regions of the plurality of display panels may comprise: forming a m*n display region array by the rectangular display regions of the plurality of display panels so as to form the larger rectangular display region, each of m and n being a natural number.

According to another exemplary embodiment of the method, included angles between the third folding line and the first folding line and between the third folding line and the second folding line may be 45 degrees.

According to another exemplary embodiment of the method, the side portions of the outer region may have the same width.

According to another exemplary embodiment of the method, a direction of folding along the first folding line and a direction of folding along the second folding line may be opposite to a direction of folding along the third folding line, the direction of folding along the first folding line and the direction of folding along the second folding line are set towards the back side of the display panel, and the direction of folding along the third folding line is set towards the displaying side of the display panel.

According to another exemplary embodiment of the method, four folded corner portions of each display panel may be located within a rectangular space formed by the four folded side portions of the display panel.

According to another exemplary embodiment of the method, a direction of folding along the first folding line and a direction of folding along the third folding line may be opposite to a direction of folding along the second folding line, the direction of folding along the first folding line and the direction of folding along the third folding line are set towards the back side of the display panel, and the direction of folding along the second folding line is set towards the displaying side of the display panel.

According to another exemplary embodiment of the method, each of four folded corner portions of each display panel may be disposed to abut against an adjacent folded side portion.

According to another exemplary embodiment of the method, each display panel may further comprise: circuit structures configured for the rectangular display region, the circuit structures being disposed within the side portions of the outer region, the circuit structures comprising a data signal circuit structure and a gate driving circuit structure; a signal COF located outside of the outer regions and connected with the data signal circuit structure; and a gate driving COF located outside of the outer regions and connected with the gate driving circuit structure. The signal COF and the gate driving COF are arranged such that they are disposed at the back side of the display panel after the display panel is folded.

In a still further aspect of the present disclosure, there is provided a display device, which may comprise the display panel as described above or the display panel assembly as described above.

Advantageous technical effect of the technical solutions of the present disclosure may be as follows.

With the display panel of the present disclosure, side portions may be folded and disposed underneath the rectangular display region (i.e., the side portions are bended towards a back side of the display panel). Since completeness of the frame-shaped enclosing structure is not damaged, a display panel having no side portions or having narrow side portions may be realized, while moisture and oxygen may be efficiently prevented from entering the rectangular display region.

DETAILED DESCRIPTION OF PREFERRED EMBODIMENTS

Figure 1:
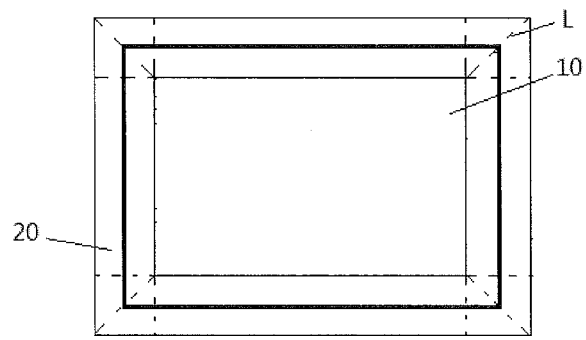
FIG. 1 is an illustrative diagram showing a display panel according to an exemplary embodiment of the present disclosure, wherein outer regions of the display panel are not folded.

Exemplary embodiments of the present disclosure that are shown in the drawings will be described in detail, in which the same or similar numerals indicate the same or similar members. The embodiments described hereinafter in conjunction with the drawing are exemplary. The embodiments are provided to set forth the concept of the present disclosure, and should not be construed as a limitation to the present disclosure.

Figure 2:
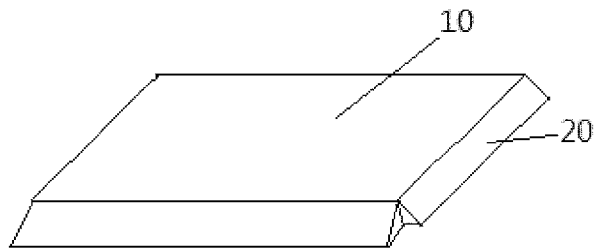
FIG. 2 is an illustrative diagram showing the display panel of FIG. 1 with outer regions thereof being folded partially towards a back side.
Figure 3:
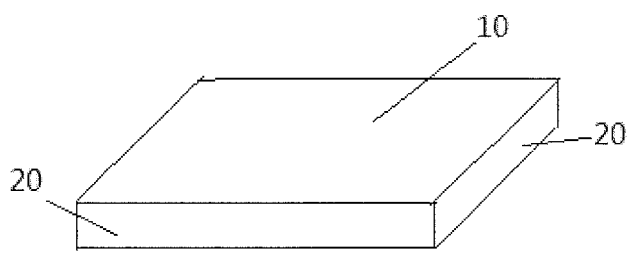
FIG. 3 is an illustrative diagram showing the display panel of FIG. 1 with outer regions thereof being folded by 90 degrees towards the back side.

With reference to FIGS. 1-3, a display panel according to an exemplary embodiment of the present disclosure has a displaying side and a back side opposite to the displaying side, and the display panel includes:

a rectangular display region 10 for displaying an image, the rectangular display region 10 having four sides and four corners formed by any two adjacent sides respectively; and an outer region 20 surrounding the rectangular display region 10, the outer region 20 being in a shape of a rectangular frame, the outer region having four side portions corresponding to the four sides of the rectangular display region 10 respectively and four corner portions each connecting two adjacent side portions, the outer region being provided therein with a closed frame-shaped enclosing structure 22 extending along the entire outer region.

In this embodiment, a length of each side portion is equal to that of a corresponding side of the rectangular display region 10, and each outer region 20 is adapted to be folded towards the back side (for example, the display panel may be a flexible display panel). Thus, in order to facilitate folding of each side portion towards the back side of the display panel, a folding process needs to be performed on the four corner portions of the outer region. Specifically, as shown in FIG. 1, three folding lines L are provided at each of the four corner portions of the outer region 20, and a first folding line and a second folding line of the three folding lines lie in extension lines of two adjacent sides of the rectangular display region respectively, in other words, the first folding line and the second folding line lie at boundary lines between the corner portion and two adjacent side portions respectively. A third folding line of the three folding lines extends from a corner of the rectangular display region 10 corresponding to one of the corner portions along a straight line between the first folding line and the second folding line, such that sharp angles formed between the third folding line and the first folding line and between the third folding line and the second folding line respectively.

It is to be noted that, although each corner portion of the outer region 20 of the display panel is already provided with three folding lines indicated by dash lines of FIG. 1, these folding lines may be pre-formed before folding so as to facilitate the folding, or they may be formed after the folding. The folding lines indicated by the dash lines of FIG. 1 are mainly used to indicate positions of the three folding lines.

According to an embodiment, a direction of folding along the first folding line and a direction of folding along the second folding line are opposite to a direction of folding along the third folding line. As shown in FIGS. 2 and 3, in order to hide the four corner portions of the outer region 20 within a space formed after the display panel is folded, the direction of folding along the first folding line and the direction of folding along the second folding line are set towards the back side of the display panel, while the direction of folding along the third folding line is set towards the displaying side of the display panel. However, the present disclosure is not limited thereto. According to an embodiment of the present disclosure that is not shown in the drawings, the direction of folding along the first folding line and the direction of folding along the third folding line (or, the second folding line and the second folding line) may be set towards the back side of the display panel, while the direction of folding along the second folding line (or the third folding line) is set toward the displaying side of the display panel. In such a manner, the corner portion that is folded and located outside of the rectangular display region may be further folded to abut against to a part of the side portion that is already folded to a lower side (i.e., the back side) of the rectangular display region. So that, the folded corner portion only occupies a small space outside the rectangular display region, thereby a narrow bezel design may still be achieved without cutting the display panel.

Since side portions are disposed at the lower side (i.e., the back side of the display panel) of the rectangular display region through folding, completeness of the frame-shaped enclosing structure 22 is maintained. Therefore, moisture and oxygen may be prevented from entering the rectangular display region while a none-bezel or narrow-bezel display is achieved.

In an exemplary embodiment of the present disclosure, preferably, included angles between the third folding line and the first folding line and between the third folding line and the second folding line are 45 degrees. In this condition, the entire outer region 20 is folded by 90 degrees towards the back side while completeness of the frame-shaped enclosing structure 22 is maintained, such that a none-bezel display may be further achieved. Further preferably, the outer region 20 has a constant width, that is, each side portion has the same width, such that each corner portion is a square. In such a manner, the display panel will have a constant thickness in a direction perpendicular to the rectangular display region after being folded, as shown in FIG. 3, and no further modification to the folded display panel regarding thickness is needed after the display panel is folded.

Figure 4:
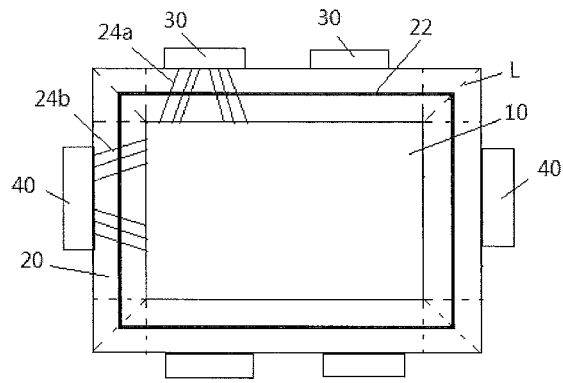
FIG. 4 is an illustrative diagram showing the display panel of FIG. 1 with a signal COF and a gate drive COF disposed thereon.

As shown in FIG. 4, the outer region is provided therein with circuit structure(s) for the rectangular display region 10, and the circuit structures may, for example, include a data signal circuit structure 24a and a gate driving circuit structure 24b. It can be understood by an ordinary skilled in the art that, since circuit structures are not suitable to be folded, these circuit structures are located within the four side portions, such that the part of the outer region that is folded is limited to the corner portions between the side portions.

As shown in FIG. 4, the display panel may further include a signal Chip On Film (COF) component 30 located outside of the outer region 20 and connected with the data signal circuit structure, and a gate driving COF 40 located outside of the outer region 20 and connected with the gate driving circuit structure. The data signal circuit structure and the gate driving circuit structure may be located within one or more side portions of the outer region, which is specifically limited in the present disclosure. For example, the data signal circuit structure and the gate driving circuit structure may be located within one side portion of the outer region, or two side portions of the outer region that are perpendicular to each other, or three side portions of the outer region, or four side portions of the outer region (as shown in FIG. 4). Correspondingly, the signal COF 30 and the gate driving COF 40 are located respectively at outer sides of the side portions where the data signal circuit structure and the gate driving circuit structure are located.

Figure 5:
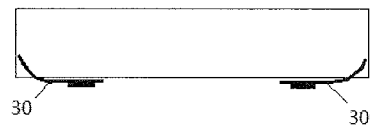
FIG. 5 is an illustrative diagram showing a signal COF and a gate drive COF disposed at a back side of a display panel.

As shown in FIG. 5, the signal COF 30 and the gate driving COF 40 are arranged such that they may be bended so as to be disposed at the back side of the display panel 20 when the display panel is folded.

Figure 6:
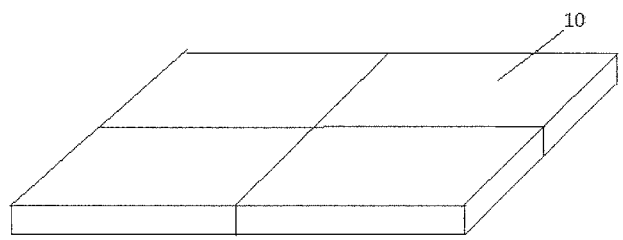
FIG. 6 is an illustrative diagram showing a display panel assembly according to another exemplary embodiment of the present disclosure.

FIG. 6 is an illustrative view of a display panel assembly according to another exemplary embodiment of the present disclosure. The display panel assembly includes: a m*n array comprised of a plurality of the above described display panels, wherein each of m and n is a natural number, and the rectangular display regions of these display panels are spliced together to form a large rectangular display region.

It can be seen from FIG. 6 that, with the display panel according to the embodiment of the present disclosure, no gap or substantially no gap exists between rectangular display regions of any two adjacent display panels in a display panel assembly, such that non-display region formed by outer regions of the adjacent display panels may be eliminated or reduced, and simultaneously, the outer regions are only folded to the back side of the display panel using the manner defined in the present disclosure without damaging the completeness of the frame-shaped enclosing structure, and a possibility of moisture and oxygen entering the display region is thereby significantly decreased compared with technical solutions in prior art.

In an exemplary embodiment of the present disclosure, for each of the display panels, the data signal circuit structure is connected with the signal COF located outside of the outer region, and the gate driving circuit structure is connected with the gate driving COF located outside of the outer region; and in the display panel assembly, each of the signal COF and the gate driving COF is disposed at the back side of its corresponding display panel.

An embodiment of the present disclosure further provides a method of manufacturing the display panel assembly. The method may include the following steps:

In a first step, a plurality of display panels are provided, wherein each of the display panels has a displaying side and a back side opposite to the displaying side, each of the display panels includes a rectangular display region and an outer region surrounding the rectangular display region, each rectangular display region has four sides and four corners each formed by two adjacent sides of the four sides, each outer region is in a shape of a rectangular frame, each outer region has four side portions and four corner portions corresponding to the four corners of the rectangular display region respectively, and the outer region is provided therein with a closed frame-shaped enclosing structure extending along the entire outer region, as shown in FIG. 1;

In a second step, each outer region is folded towards the back side along the boundary lines between the side portions and the rectangular display region, and each corner portion of the outer region is folded along three folding lines provided at a corresponding corner portion of the outer region, the first folding line and the second folding line of the three folding lines lie in extension lines of two adjacent sides of the rectangular display region respectively, and the third folding line of the three folding lines extends from a corner of the rectangular display region corresponding to one of the corner portion along a straight line between the first folding line and the second folding line, as shown in FIGS. 2 and 3; and In a third step, the rectangular display regions of the plurality of display panels are spliced together to form a larger display region, as shown FIG. 6.

In an exemplary embodiment of the present disclosure, preferably, included angles between the third folding line and the first folding line and between the third folding line and the second folding line are 45 degrees. In this condition, the entire outer region 20 is folded by 90 degrees towards the back side while completeness of the frame-shaped enclosing structure 22 is maintained, such that a display have no bezel may be further achieved. According to a further embodiment, the side portions of the outer region have the same width.

According to an exemplary embodiment of the method, if a direction of folding along the first folding line and a direction of folding along the second folding line are opposite to a direction of folding along the third folding line, the direction of folding along the first folding line and the direction of folding along the second folding line are set towards the back side of the display panel, and the direction of folding along the third folding line is set towards the displaying side of the display panel, then the four folded corner portions of each display panel are located within a rectangular space formed by the four folded side portions of the display panel.

According to an alternative exemplary embodiment of the method, if a direction of folding along the first folding line and a direction of folding along the third folding line are opposite to a direction of folding along the second folding line, the direction of folding along the first folding line and the direction of folding along the third folding line are set towards the back side of the display panel, and the direction of folding along the second folding line is set towards the displaying side of the display panel, then each of four folded corner portions of each display panel may be disposed to abut against an adjacent folded side portion.

An embodiment of the present disclosure further provides a display device, which includes the above described display panel or display panel assembly. The display device may comprises: a liquid crystal panel, an electronic paper, an OLED panel, a mobile phone, a tablet computer, a TV set, a display, a notebook computer, a digital frame, a navigator, or any produce or component that has a display function.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A display panel having a displaying side and a back side opposite to the displaying side, the display panel comprising:
    a rectangular display region for displaying an image, the rectangular display region having four sides and four corners formed by adjacent sides respectively; and
    an outer region surrounding the rectangular display region, the outer region being in a shape of a rectangular frame, the outer region having four side portions corresponding to the four sides of the rectangular display region respectively and four corner portions each connecting two adjacent side portions, the outer region being provided therein with a closed frame-shaped enclosing structure extending along the entire outer region,
    wherein three folding lines are provided at each of the corner portions of the outer region, a first folding line and a second folding line of the three folding lines lie in extension lines of two adjacent sides of the rectangular display region respectively, and a third folding line of the three folding lines extends from a corner of the rectangular display region corresponding to one of the corner portions along a straight line between the first folding line and the second folding line.

2. The display panel according to claim 1, wherein included angles between the third folding line and the first folding line and between the third folding line and the second folding line are 45 degrees.

3. The display panel according to claim 2, wherein the side portions of the outer region have the same width.

4. The display panel according to claim 1, wherein a direction of folding along the first folding line and a direction of folding along the second folding line are opposite to a direction of folding along the third folding line, the direction of folding along the first folding line and the direction of folding along the second folding line are set towards the back side of the display panel, and the direction of folding along the third folding line is set towards the displaying side of the display panel.

5. The display panel according to claim 1, wherein a direction of folding along the first folding line and a direction of folding along the third folding line are opposite to a direction of folding along the second folding line, the direction of folding along the first folding line and the direction of folding along the third folding line are set towards the back side of the display panel, and the direction of folding along the second folding line is set towards the displaying side of the display panel.

6. The display panel according to claim 1, wherein the display panel further comprises circuit structures used for the rectangular display region, the circuit structures being disposed within the side portions of the outer region.

7. The display panel according to claim 6, wherein the circuit structures comprise a data signal circuit structure and a gate driving circuit structure, and the display panel further comprises:
a signal COF located outside of the outer region and connected with the data signal circuit structure; and
a gate driving COF located outside of the outer region and connected with the gate driving circuit structure.

8. The display panel according to claim 7, wherein the signal COF and the gate driving COF are arranged such that they are disposed at the back side of the display panel when the display panel is folded.

9. A display panel assembly, comprising:
a m*n display panel array comprised of a plurality of the display panels according to claim 1,
wherein each of m and n is a natural number, and the rectangular display regions of the plurality of display panels are spliced together to form a larger rectangular display region.

10. A display device, comprising the display panel assembly according to claim 9.

11. A display device, comprising the display panel according to claim 1.

12. A method of manufacturing a display panel assembly, comprising steps of:
providing a plurality of display panels, wherein each of the display panels has a displaying side and a back side opposite to the displaying side, each of the display panels includes a rectangular display region and an outer region surrounding the rectangular display region, each rectangular display region has four sides and four corners each formed by two adjacent sides of the four sides, each outer region is in a shape of a rectangular frame, the outer region has four side portions and four corner portions corresponding to the four corners of the rectangular display region respectively, and the outer region is provided therein with a closed frame-shaped enclosing structure extending along the entire outer region;
folding each outer region towards the back side along boundary lines between the side portions and the rectangular display region, and folding each of the corner portions of the outer region along three folding lines provided at a corresponding corner portion of the outer region, a first folding line and a second folding line of the three folding lines lying in extension lines of two adjacent sides of the rectangular display region respectively, a third folding line of the three folding lines extending from a corner of the rectangular display region corresponding to one of the corner portions along a straight line between the first folding line and the second folding line; and
splicing the rectangular display regions of the plurality of display panels together to form a larger display region.

13. The method according to claim 12, wherein the step of splicing the rectangular display regions of the plurality of display panels comprises: forming a m*n display region array by the rectangular display regions of the plurality of display panels so as to form the larger rectangular display region, each of m and n being a natural number.

14. The method according to claim 13, wherein the side portions of the outer region have the same width.

15. The method according to claim 12, wherein included angles between the third folding line and the first folding line and between the third folding line and the second folding line are 45 degrees.

16. The method according to claim 12, wherein a direction of folding along the first folding line and a direction of folding along the second folding line are opposite to a direction of folding along the third folding line, the direction of folding along the first folding line and the direction of folding along the second folding line are set towards the back side of the display panel, and the direction of folding along the third folding line is set towards the displaying side of the display panel.

17. The method according to claim 16, wherein four folded corner portions of each display panel are located within a rectangular space formed by the four folded side portions of the display panel.

18. The method according to claim 12, wherein a direction of folding along the first folding line and a direction of folding along the third folding line are opposite to a direction of folding along the second folding line, the direction of folding along the first folding line and the direction of folding along the third folding line are set towards the back side of the display panel, and the direction of folding along the second folding line is set towards the displaying side of the display panel.

19. The method according to claim 18, wherein each of four folded corner portions of each display panel is disposed to abut against an adjacent folded side portion.

20. The method according to claim 12, wherein each display panel further comprises:
circuit structures configured for the rectangular display region, the circuit structures being disposed within the side portions of the outer region, the circuit structures comprising a data signal circuit structure and a gate driving circuit structure;
a signal COF located outside of the outer regions and connected with the data signal circuit structure; and
a gate driving COF located outside of the outer regions and connected with the gate driving circuit structure;
wherein the signal COF and the gate driving COF are arranged such that they are disposed at the back side of the display panel after the display panel is folded.

* * * * *